United States Patent [19]
Smith et al.

[11] Patent Number: 5,912,927
[45] Date of Patent: Jun. 15, 1999

[54] MULTI-CHANNEL TRANSMITTER HAVING AN ADAPTIVE ANTENNA ARRAY

[75] Inventors: Paul Fielding Smith, North Richland Hills; Robert Mark Harrison, Grapevine, both of Tex.

[73] Assignee: Motorola, Inc., Schaumburg, Ill.

[21] Appl. No.: 09/022,516

[22] Filed: Feb. 12, 1998

Related U.S. Application Data

[60] Division of application No. 08/509,122, Jul. 31, 1995, Pat. No. 5,748,683, which is a continuation-in-part of application No. 08/366,283, Dec. 29, 1994, Pat. No. 5,579,341.

[51] Int. Cl.$^6$ .................................................. H04B 7/06
[52] U.S. Cl. ....................... 375/299; 375/260; 375/267; 455/25; 455/101; 455/103
[58] Field of Search ................................. 375/260, 267, 375/299; 455/101, 103, 500, 25

[56] References Cited

U.S. PATENT DOCUMENTS

| | | | |
|---|---|---|---|
| 4,188,582 | 2/1980 | Cannalte et al. | 455/92 |
| 4,490,830 | 12/1984 | Kai et al. | 375/299 |
| 5,134,633 | 7/1992 | Werner | 375/260 |
| 5,170,413 | 12/1992 | Hess et al. | 375/260 |
| 5,187,807 | 2/1993 | Alard et al. | 455/17 |
| 5,208,804 | 5/1993 | Wilson et al. | 370/343 |
| 5,239,560 | 8/1993 | Daniel | 375/260 |
| 5,243,629 | 9/1993 | Wei | 375/299 |
| 5,274,836 | 12/1993 | Lux | 455/1 |
| 5,499,389 | 3/1996 | Victorin | 455/119 |
| 5,570,356 | 10/1996 | Finney et al. | 370/476 |
| 5,579,341 | 11/1996 | Smith et al. | 375/267 |
| 5,778,307 | 7/1998 | Budnik | 455/103 |

Primary Examiner—Young T. Tse
Attorney, Agent, or Firm—Bruce Terry

[57] ABSTRACT

A multi-channel transmitter (200) in accordance with the present invention overcomes the disadvantages of applying adaptive antenna array technology to multi-channel communication systems. The multi-channel transmitter includes a channel processing element (210), a plurality of radio frequency processing elements (206), and an antenna array (102). The channel processing element includes a channel processor adapted to receive a communication signal from a communication network, a splitter (216) coupled to an output of the channel processor for producing a plurality of substantially identical processed digital communication signal outputs. A plurality of gain and phase adjusters (214) in the channel processing element are coupled to the substantially identical processed digital communication signal outputs. An output of each phase and gain adjuster (214) is coupled to a plurality of up-converters (212), which each produce a digital intermediate frequency output. The plurality of radio frequency processing elements (206) are each coupled to an output of the digital up-converters (212). The radio frequency processing elements (206) each include a digital summer (224), a digital-to-analog converter (222), and a radio frequency processor (220). The antenna array has a plurality of antenna elements (104), each coupled to an output of the plurality of radio frequency processing elements (206).

6 Claims, 3 Drawing Sheets

MULTI-CHANNEL TRANSMITTER HAVING AN ADAPTIVE ANTENNA ARRAY

CROSS-REFERENCE TO RELATED APPLICATIONS

This is a division of application Ser. No. 08/509,122, filed Jul. 31, 1995, entitled "Multi-channel Transceiver Having an Adaptive Antenna Array and Method," now U.S. Pat. No. 5,748,683, which is a continuation-in-part of application Ser. No. 08/366,283, now U.S. Pat. No. 5,579,341, filed Dec. 29, 1994, entitled "Multi-channel Digital Transceiver and Method." All of the above patents and/or applications, which are not admitted to be prior art with respect to the present invention by their mention in the background, are incorporated herein by this reference.

FIELD OF THE INVENTION

The present invention relates to multi-channel transceivers, and more particularly, to a multi-channel transceiver having an adaptive antenna array and a method of multi-channel transceiving through an adaptive antenna array.

BACKGROUND OF THE INVENTION

Adaptive antenna array technology is known to provide enhanced performance for radio communication systems. Adaptive antenna array systems provide greater range and capacity over traditional antenna technology due to increased antenna gain. Adaptive antenna arrays also provide the ability to "customize" coverage patterns through "beam-forming" further enhancing system performance.

In spite of these advantages, adaptive antenna array technology has not found widespread application in multi-channel communication systems. This is primarily due to the losses and signal degradation resulting from combining the large number of analog signals (in transmit mode) and splitting the large number of analog signals (in receive mode) required in multi-channel communication systems. The losses and signal degradation generally more than offset any advantage gained through utilization of the adaptive antenna array.

Therefore, there is a need for an apparatus and method of combining and splitting communication signals in a multi-channel communication systems which does not generate significant loses hence making adaptive antenna array technology applicable to multi-channel communication systems. Such a device and method are provided by the present invention, and one of ordinary skill in the art will readily appreciate the many advantages and features of the present invention from the following detailed description and accompanying drawings of several preferred embodiments.

DETAILED DESCRIPTION OF THE PREFERRED EMBODIMENTS

The receiver, transmitter and transceiver of the present invention overcome the disadvantages of applying adaptive antenna array technology to multi-channel communication systems. In accordance with a preferred embodiment of the present invention, digital signal combining and splitting is utilized to avoid losses and signal degradation. Multi-channel radio frequency (RF) signals received via an adaptive antenna array are converted from an analog form to a digital form prior to splitting and processing to recover communication channels contained therein. A number of digital communication signals are digitally combined into a multi-channel digital signal and converted from the digital form to an analog radio frequency form prior to transmission from the adaptive antenna array.

Figure 1:
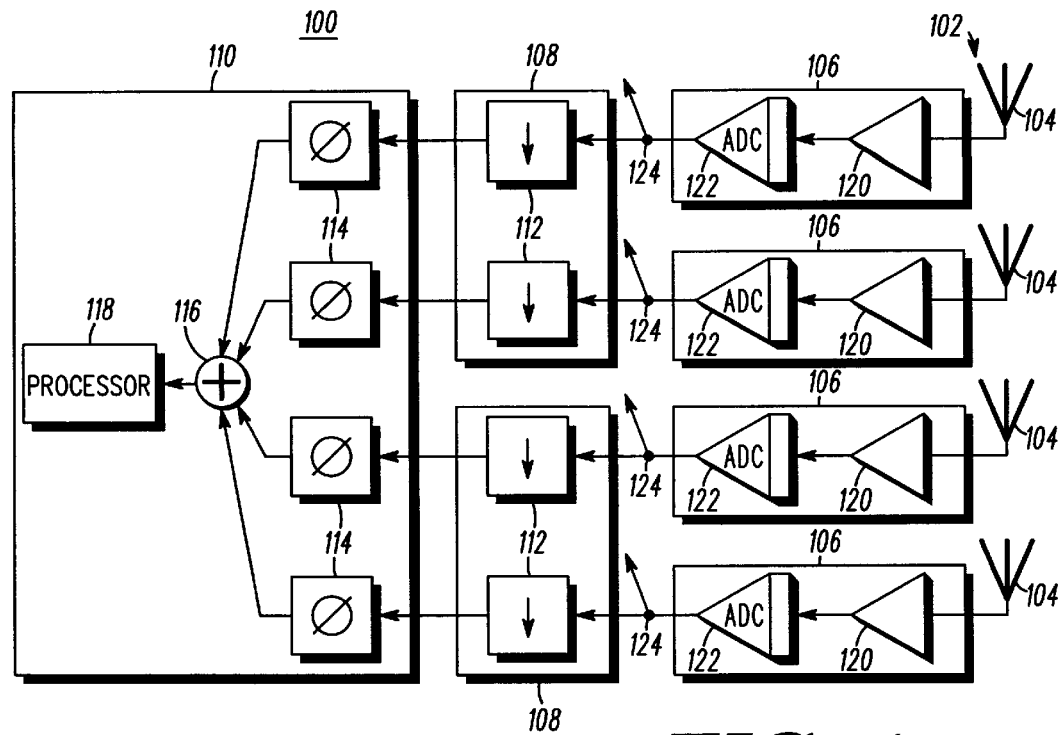
FIG. 1 is a block diagram of a receiver in accordance with a preferred embodiment of the present invention.

With reference to FIG. 1, a multi-channel receiver 100, in accordance with a preferred embodiment of the present invention, includes an adaptive antenna array 102 (shown more clearly in FIG. 3) having a plurality of antenna elements 104 which are coupled, respectively, to a plurality of receive RF elements 106. Receive RF elements 106 are coupled to a plurality of digital conversion modules 108 which are coupled to a channel processor 110. Multi-channel analog RF signals are received at antenna elements 104 and processed by receive RF elements to respectively produce multi-channel digital signals. The multi-channel digital signals are digitally down-converted in digital down-converters 112 within digital conversion modules 108 to baseband digital signals. The processing of the multi-channel RF signals to baseband digital signals may preferably be in accordance with the signal processing described in the above-referenced U.S. Pat. No. 5,579,341.

The baseband digital signals, respectively associated with each antenna element, are then communicated to channel processor 110. In general, channel processor 110 may be implemented as disclosed and described in the aforementioned U.S. Pat. No. 5,579,341 for demodulating and recovering a communication channel from a baseband digital signal. Also included in channel processor 110 are a plurality of digital phase/gain adjusters 114, each coupled to receive a baseband digital signal associated with one of antenna elements 104 and each having an output coupled to a digital summer 116. Phase/gain adjusters 114 operate on the baseband digital signal, as is known for antenna array technology, for directing the reception pattern of antenna elements 104 toward a particular transmitter operating in the communication system. The outputs of phase/gain adjusters 114 are then summed by digital summer 116 and processed via processor 118 for recovering a communication channel. The recovered communication channel is then communicated to the communication system via a suitable interface (not shown). In the preferred embodiment, phase/gain adjusters 114 are implemented as part of channel processor 110 to minimize control routing and delay times. Moreover, it is contemplated that phase/gain adjusters 114 and digital summer 116 be implemented in software operating on processor 118 performing the channel processing function.

With continued reference to FIG. 1, each of the receive RF elements 106 include RF to intermediate frequency (IF) conversion circuitry 120 and an analog-to-digital converter (ADC) 122. ADCs 122 receive IF analog signals from conversion circuitry 120 and convert the signals to IF digital signals. A digital splitter 124 is coupled to the output of receive RF elements 106 and provides for splitting the IF digital signal to digital converters (not shown) associated with additional channel processors (not shown) for recovering multiple communication channels. As will be appreciated, losses and signal degradation are substantially reduced for the multi-channel receiver 100 since the signals received by antenna elements 104 are split in a digital form.

Figure 2:
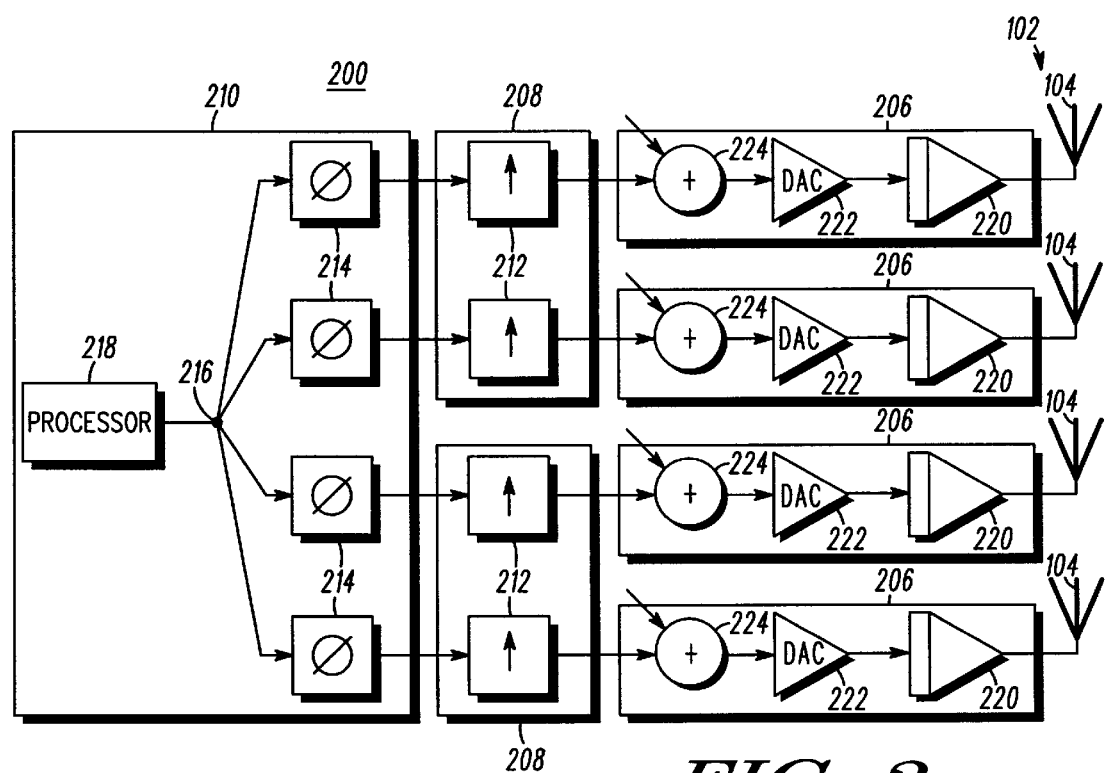
FIG. 2 is a block portion of a multi-channel transmitter in accordance with a preferred embodiment of the present invention.

With reference now to FIG. 2, multi-channel transmitter 200 incorporating the present invention, includes a channel processor 210 having a plurality of outputs, each of which is associated with one of antenna elements 104 of antenna array 102. Processor 218 receives signals from the communication system via a suitable interface (not shown), and outputs a baseband digital signal corresponding to a communication channel of the system. The baseband digital signal is split into a plurality of baseband digital signals corresponding to the number of antenna elements via splitter 216. The split signals are then communicated to phase/gain adjusters 214, which operate on the baseband digital signals, as is known for antenna arrays, for ultimately directing the radiation pattern of the signals once processed and transmitted from antenna elements 104.

The outputs from channel processor 210 are digitally up-converted to digital IF signals by digital up-converters 212 contained in digital conversion modules 208. The digital IF signals are then communicated to transmit RF elements 206. Each transmit RF element includes a digital summer 224 for summing digital IF signals corresponding to additional communication channels processed by other channel processors to form a multi-channel digital IF signal. The multi-channel digital IF signal is then converted by digital-to-analog converters (DACs) 222 to an IF analog signal which is then processed and amplified by RF circuitry 220 before being radiated from antenna elements 104. As described, the phase of the signals was suitably adjusted by phase/gain adjusters 214 at the digital level, such that a particular radiation pattern is generated from antenna elements 104 for directing the radiated signals toward a receiver operating in the communication system. Moreover, since this processing is accomplished at the digital level, and since the multi-channel combining is accomplished at the digital level, losses and signal degradation are substantially reduced for the multi-channel transmitter 200.

Figure 3:
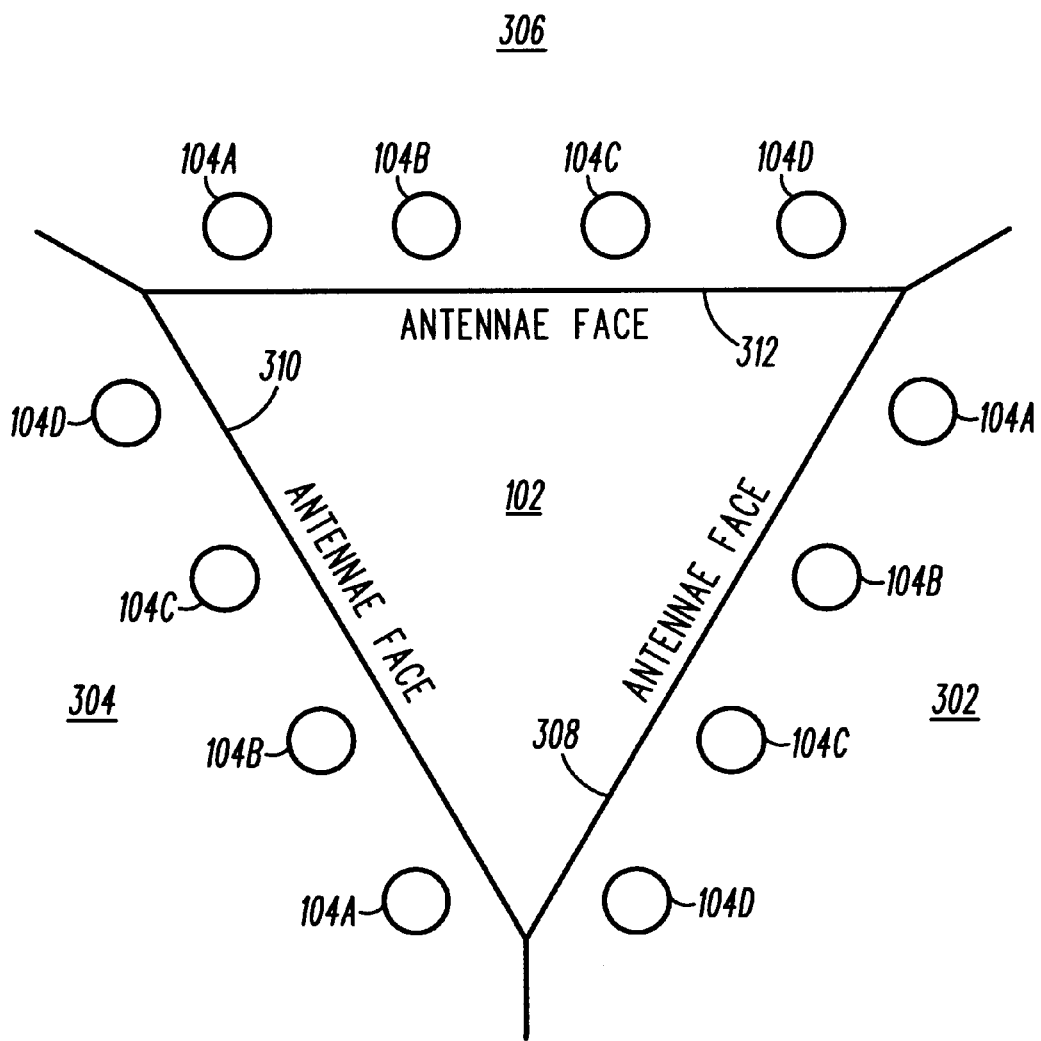
FIG. 3 is a schematic plan view of a typical antenna array which may be advantageously employed with the either the digital receiver of FIG. 1 or the transmitter of FIGS. 2 and 4.
Figure 4:
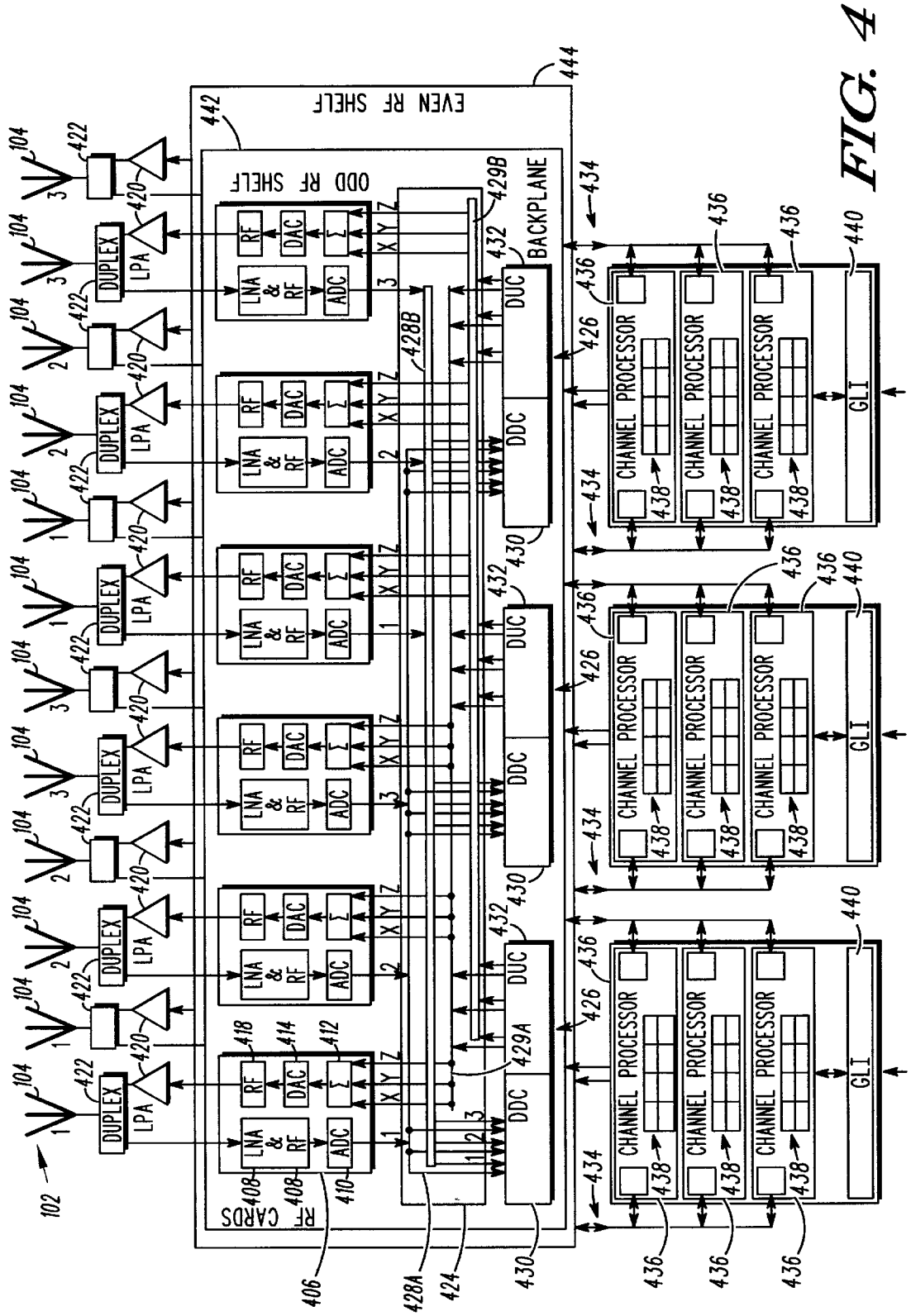
FIG. 4 is a block diagram of wideband multi-channel digital transmitter which may advantageously employ the present invention.

FIG. 4 illustrates a multi-channel digital transmitter 400 in accordance with a preferred embodiment of the present invention. Antenna array 102, which may be as shown in FIG. 3, has a plurality of antenna elements 104 coupled to RF processing cards 406. Each RF processing card 406 contains the elements of receive RF elements 106 and transmit RF elements 206. That is, for receive, RF processing cards 406 each contain RF circuitry 408 for converting the received RF analog signal to IF analog signals and ADC 410 for converting the IF analog signals to IF digital signals. Similarly for transmit, the RF processing cards contain a digital summer 412, DAC 414 and RF circuitry 418 for converting the IF analog signal from the DAC to an RF analog signal. Note that RF processing cards 406 differ slightly from those previously described, as multi-tone linear power amplifiers 420 are coupled to outputs of RF processing cards 406 for amplifying the RF analog signals prior to radiating the signals from antenna elements 104. Both input and output paths of RF processing cards 406 are coupled via a suitable duplex device 422 to antenna elements 104.

In general, RF processing cards 406 are coupled via a backplane bus structure 424 to a plurality of digital converter modules 426. The digital converter modules 426 contain a plurality of digital down-converters 430 for converting the IF digital signals to baseband digital signals in receive. They also contain a plurality of digital up-converters 432 for converting baseband digital signals to IF digital signals in transmit.

As shown, IF digital signals are selectively coupled via receive busses 428A/428B or transmit busses 429A/429B (busses 428C/D and 429C/D not shown) between digital converter modules 426 and RF processing cards 406. The baseband digital signals to/from the digital converter modules 426 are then communicated via a bus structure 434 to a plurality of channel processing cards 436 which contain a plurality of channel processors 438 to operate on the signals, as described above, to recover communication channels contained in received signals and to generate transmit communication signals. The communication channels are interfaced, receive or transmit, to the communication system via a suitable interface 440. It will be appreciated that at least as many digital up-converters and digital down-converters are provided as desired communication channels, traffic, signaling, scanning or the like, in the communication system 200.

With continued reference to FIG. 4 and reference to FIG. 3, the antenna elements 104 are grouped for servicing sectors 302, 304, and 306, respectively, of a sectored communication system. As shown, each face 308, 310 and 312, respectively, of antenna array 102 has four antenna elements 104, individually labeled A, B, C and D, with one element from each group A, B, C and D assigned to a face 308–312 of antenna array 102. In the preferred embodiment, each antenna element 104 of a group is coupled to a group of RF processing cards 406 via a group bus, for example busses 428A and 429A for antenna elements 104A, to the digital conversion modules 426.

Moreover, the groups A, B, C and D of antenna elements are bifurcated between a pair of processing shelves 442 and 444, respectively, such that the antenna elements of two groups are contained on first shelf 442 and the antenna elements of the remaining two groups are contained on second shelf 444. As should be evident, any communication channel from any channel processor 438 may be coupled to the groups A, B, C, and D of antenna elements on a face 308–312 of antenna array 104. If however, channel processors, RF processing cards, digital conversion modules, busses, or entire shelves of components fail in service, the result is only a reduction in the system capacity and/or performance.

Still additional advantages may be gained from the unique structure of the transceiver. With reference to FIG. 3, there are illustrated sectors 302–306 of a communication cell formed about antenna array 102. Traditionally, when a subscriber, via a mobile communication unit, is operating in a sector of a communication cell, only antenna elements associated with the face of the antenna array servicing that sector of the cell are operable for servicing the communication unit. However, transmitter 400 of the present invention may be dynamically configured to enhance the coverage provided to the communication unit. As the communication unit moves from sector 302 to sector 304, for example, element 104A assigned to face 302 no longer effectively services the communication unit. To compensate, element 104A associated with face 304 is brought up to service the communication unit while element 104A associated with face 302 is deactivated. In this manner, areas of poor communication quality normally associated with a transition from one sector to another sector may be reduced or eliminated.

Thus, it should be readily appreciated that the present invention overcomes the deficiencies associated with applying antenna array technology to multi-channel communication systems by providing for digital signal splitting and combining. Moreover, the unique transceiver structure of the present invention provides enhanced system reliability and improved performance. In addition, further advantages and modifications will readily occur to those skilled in the art. The invention, in its broader aspects, is therefore not limited to the specific details, representative apparatus, and illustrative examples shown and described herein. Various modifications and variations can be made to the above specification without varying from the scope or spirit of the invention, and it is intended that the present invention cover all such modifications and variations provided they fall within the scope of the following claims and their equivalents.

What is claimed is:

1. A multi-channel transmitter comprising:

a channel processing element comprising:

a channel processor having an input adapted to receive a communication signal from a communication network and a processed digital communication signal output;

a splitter having an input coupled to the processed digital communication signal output and a plurality of substantially identical processed digital communication signal outputs;

a plurality of gain and phase adjusters each having an input coupled to one of the substantially identical processed digital communication signal outputs and a phase adjusted signal output; and a plurality of digital up-converters, each digital up-converter having an input coupled to one of the phase adjusted signal outputs and each having a digital intermediate frequency output; and a plurality of radio frequency processing elements, each radio frequency processing element being coupled to one of the plurality digital intermediate frequency outputs and each radio frequency processing element comprising:

a digital summer having a plurality of inputs one of which being coupled to the digital intermediate frequency output and having a summed signal output;

a digital-to-analog converter having an input coupled the summed signal output and an analog intermediate frequency signal output; and a radio frequency processor having an input coupled to the intermediate frequency signal output and an amplified radio frequency signal output; and an antenna array having a plurality of antenna elements respectively coupled to the plurality of radio frequency processing elements.

2. The multi-channel transmitter of claim 1 wherein the antenna array comprises a plurality of faces and a plurality of antenna elements associated with each face.

3. The multi-channel transmitter of claim 2 wherein each of the plurality of antenna elements associated with each face is coupled to one of the plurality of radio frequency processing elements.

4. The multi-channel transmitter of claim 1 including a plurality of channel processing elements.

5. The multi-channel transmitter of claim 1 further comprising first and second radio frequency processing shelves, the first radio frequency processing shelf comprising a first portion of the plurality of radio frequency processing elements, and the second radio frequency processing shelf comprising a second portion of the plurality of radio frequency processing elements.

6. The multi-channel transmitter of claim 5 further comprising a transmit bus coupled to each of the plurality of digital intermediate frequency outputs and each of the plurality of radio frequency processing elements for coupling a selected one of the plurality of digital intermediate frequency outputs to a selected one of the plurality of radio frequency processing elements.

* * * * *